(12) United States Patent
Satou et al.

(10) Patent No.: US 6,970,050 B2
(45) Date of Patent: Nov. 29, 2005

(54) OSCILLATOR AND HIGH-FREQUENCY SUPERPOSING MODULE FOR DRIVING LASER DIODE

(75) Inventors: Yoshirou Satou, Shiga-ken (JP); Kazuhiro Iida, Shiga-ken (JP); Masamichi Tamura, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 83 days.

(21) Appl. No.: 10/735,758

(22) Filed: Dec. 16, 2003

(65) Prior Publication Data

US 2004/0160284 A1   Aug. 19, 2004

(30) Foreign Application Priority Data

Feb. 18, 2003  (JP) .............................. 2003-039581

(51) Int. Cl.[7] .............................................. H03B 5/18
(52) U.S. Cl. ................... 331/117 R; 331/185
(58) Field of Search .......................... 331/117 R, 185, 331/177 R, 177 V (56) References Cited

U.S. PATENT DOCUMENTS

| | | | |
|---|---|---|---|
| 5,126,695 A | | 6/1992 | Abe |
| 6,069,857 A | * | 5/2000 | Schell et al. .............. 369/53.28 |
| 6,081,168 A | * | 6/2000 | Park ............................ 331/179 |
| 6,384,693 B1 | * | 5/2002 | Fujidai et al. .............. 331/179 |

FOREIGN PATENT DOCUMENTS

| | | |
|---|---|---|
| JP | 03-159582 | 7/1991 |
| JP | 07-093758 | 4/1995 |

* cited by examiner

*Primary Examiner*—Joseph Chang
(74) *Attorney, Agent, or Firm*—Keating & Bennett, LLP (57) ABSTRACT

An oscillator includes a transistor, a first bias resistor connected between the base of the transistor and a power input terminal, and a second bias resistor connected between the base of the transistor and a control-voltage input terminal. When the control-voltage input terminal is grounded, the bias voltage at the base of the transistor is below a predetermined threshold, thus causing the oscillator to stop oscillation. When the control-voltage input terminal is open, the bias voltage at the base of the transistor is above the threshold, thus causing the oscillator to start oscillation.

16 Claims, 8 Drawing Sheets

OSCILLATOR AND HIGH-FREQUENCY SUPERPOSING MODULE FOR DRIVING LASER DIODE

BACKGROUND OF THE INVENTION

1. Field of the Invention

The present invention relates to an oscillator for generating a high-frequency signal and to a high-frequency superposing module including such an oscillator for driving a laser diode.

2. Description of the Related Art

A laser-diode drive circuit is one of various applications of a high-frequency oscillating circuit. In a conventional laser-diode drive circuit, a laser diode is driven in a multiple mode where a high-frequency current is superposed on a driving DC current, thereby preventing the generation of mode-hopping noise resulting from an increase in the temperature of the laser diode. For superposing a high-frequency current on a DC current, an oscillating circuit that generates a high-frequency signal is used as disclosed in, for example, Japanese Unexamined Patent Application Publication No. 7-93758.

Figure 8:
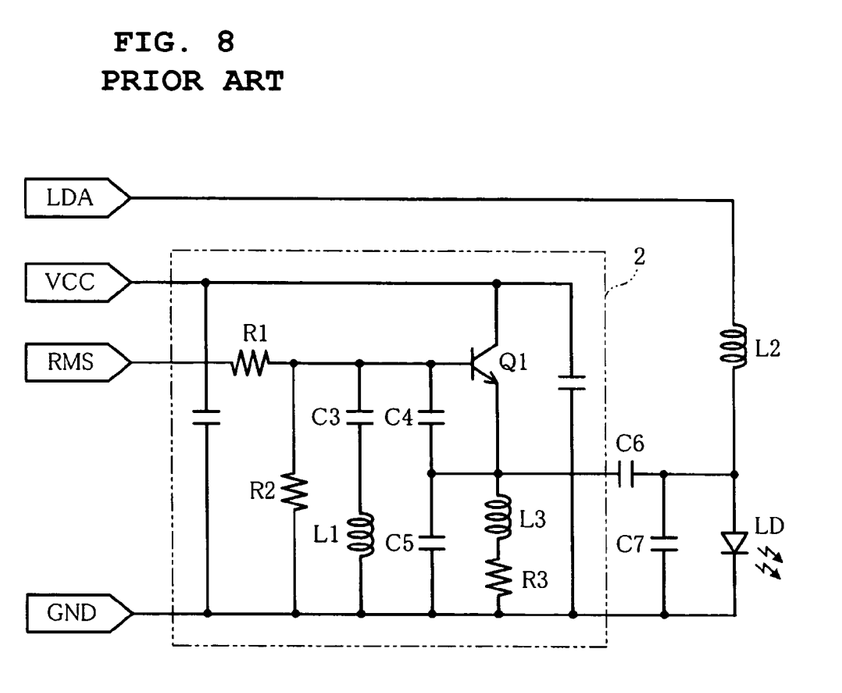
FIG. 8 is a circuit diagram of a conventional laser-diode drive circuit.

FIG. 8 is a circuit diagram of a laser-diode drive circuit disclosed in Japanese Unexamined Patent Application Publication No. 7-93758. In this circuit, a DC current is supplied via an input terminal LDA to a laser diode LD and power is supplied to an oscillating circuit 2 via a power input terminal VCC. Resistors R1, R2, and R3 apply a predetermined DC bias to a transistor Q1. This oscillating circuit 2 is a Colpitts oscillator and its oscillation frequency is determined by the values of capacitors C3, C4, and C5 and inductors L1 and L3. The oscillation output of the oscillating circuit 2 is passed to the laser diode LD via a matching circuit composed of capacitors C6 and C7. FIG. 8 also shows an oscillation control terminal RMS and a ground terminal GND. When the oscillation control terminal RMS has a potential equal to that of the power input terminal VCC, a predetermined bias voltage is applied to the base of the transistor Q1 to start oscillation. When the oscillation control terminal RMS is open, the potential at the base of the transistor Q1 is substantially 0, thus stopping oscillation.

A laser-diode drive circuit as described above requires the oscillating circuit to be turned ON/OFF. For example, the oscillating circuit would be turned ON to superpose a high-frequency signal for the laser diode when data is read from a DVD or turned OFF to stop superposing a high-frequency signal when data is written to the DVD. Unfortunately, the conventional laser-diode drive circuit shown in FIG. 8 takes a long time until the oscillating circuit 2 starts oscillation. This mechanism is described below. As shown in FIG. 8, the oscillating circuit 2 has the base line of the transistor Q1 connected to the ground level via the resistor R2 when the oscillation control terminal RMS is open (that is, no voltage is applied to the oscillation control terminal RMS). In this structure, when the oscillation control terminal RMS is switched to have a potential equal to that of the power input terminal VCC (power supply voltage) to start oscillation, the oscillating circuit 2 needs to increase the potential at the base line of the transistor Q1 from the ground level to the required level. In other words, it takes some time until the capacitors C3, C4, and C5 are charged to increase the potential at the base of the transistor Q1 to the required level.

For a system that requires oscillation to be activated/deactivated within a short period of time for a laser diode, slow response of the oscillating circuit adversely affects the response of the entire system. In short, slow activation of the oscillating circuit leads to an undesirable state where reading from and writing to a DVD require a long time.

The oscillating circuit 2 has been described as applied to a laser-diode drive circuit. However, the same problem occurs in applications that require a quick response in the activation/deactivation of oscillation.

SUMMARY OF THE INVENTION

In order to overcome the problems described above, preferred embodiments of the present invention provide an oscillator with a quick response, that is, an oscillator that requires only a short transition time from an oscillating state to a non-oscillating state or vice versa.

In addition, preferred embodiments of the present invention provide a high-frequency superposing module for driving a laser diode which includes the quick response oscillator described above, thus reducing a switching time between ON and OFF of high-frequency superposition for the laser diode.

According to a preferred embodiment of the present invention, an oscillator includes an oscillating active element, a capacitor connected between the feedback-signal input terminal of the oscillating active element and the ground, a first bias resistor connected between the feedback-signal input terminal and a power input terminal, and a second bias resistor connected between the feedback-signal input terminal and a control-voltage input terminal. In this oscillator, the first bias resistor and the second bias resistor have values so that when the control-voltage input terminal is grounded, the bias voltage at the feedback-signal input terminal is above the ground potential and below a threshold for continuous oscillation of the oscillating active element, and when the control-voltage input terminal is open, the bias voltage at the feedback-signal input terminal is above the threshold.

This approach allows the bias voltage at the feedback-signal input terminal (base of the transistor) to exceed a predetermined threshold quickly when the control-voltage input terminal is open, thereby reducing a transition time from a non-oscillating state to an oscillating state. Similarly, when the control-voltage input terminal is grounded, the bias voltage at the feedback-signal input terminal (base of the transistor) drops below the threshold quickly, thereby reducing a transition time from an oscillating state to a non-oscillating state.

According to another preferred embodiment of the present invention, a high-frequency superposing module for driving a laser diode includes the above-described oscillator for superposing a high-frequency current for the laser diode, a drive-signal output terminal connected to the anode of the laser diode, and an impedance matching circuit connected between the drive-signal output terminal and the output section of the oscillator. Thus, superposition of a high-frequency signal for the laser diode can be switched ON/OFF within a short period of time, thereby enhancing the response of the entire system that uses the laser diode.

Other features, elements, characteristics and advantages of the present invention will become more apparent form the following detailed description of preferred embodiments with reference to the attached drawings.

DETAILED DESCRIPTION OF PREFERRED EMBODIMENTS

Figure 1:
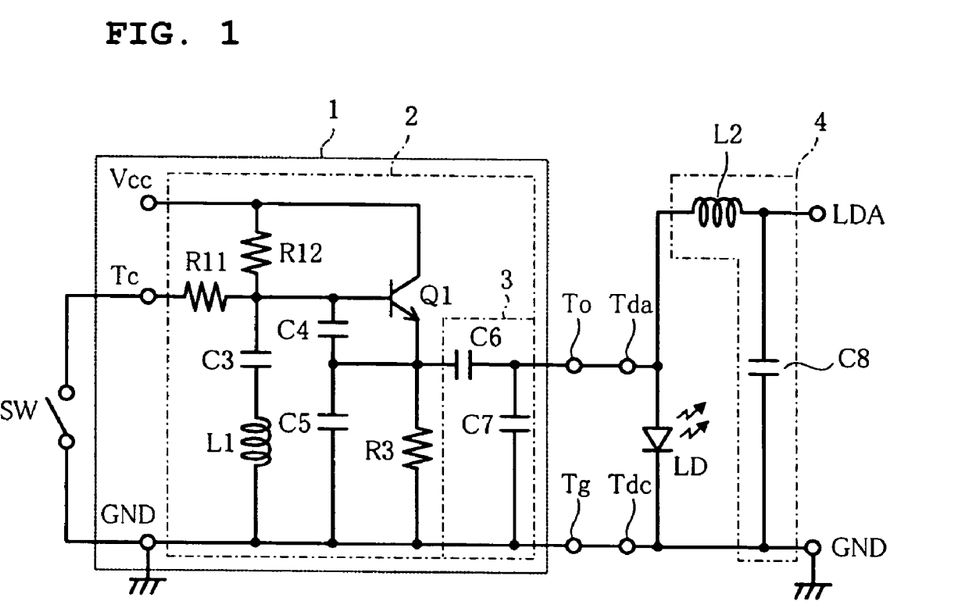
FIG. 1 is a circuit diagram of a high-frequency superposing module for driving a laser diode according to a first preferred embodiment of the present invention.

FIG. 1 is a circuit diagram of a high-frequency superposing module 1 for driving a laser diode LD according to a first preferred embodiment of the present invention. In FIG. 1, a noise suppression filter circuit 4 including a capacitor C8 and an inductor L2 is disposed between a power terminal LDA and the laser diode LD. The laser diode LD has an anode terminal Tda and a cathode terminal Tdc connected to a ground terminal GND. The high-frequency superposing module 1 has a terminal To for outputting a drive signal and a ground terminal Tg. To operate the high-frequency superposing module 1, the terminals To and Tg are connected to the terminals Tda and Tdc, respectively. If the high-frequency superposing module 1 is not connected, the laser diode LD is driven only by a DC current supplied from the power terminal LDA.

The high-frequency superposing module 1 also has a power input terminal VCC and a ground terminal GND. An oscillating circuit 2 includes a resistor R12 connected between the base and collector of a transistor Q1 and a resistor R3 connected between the emitter of the transistor Q1 and the ground. The resistors R12 and R3 together constitute a DC bias circuit section for the transistor Q1. Between the base of the transistor Q1 and the ground are connected a series circuit section including a capacitor C3 and an inductor L1 and a series circuit section of capacitors C4 and C5. The node between the capacitors C4 and C5 is connected to the emitter of the transistor Q1 to apply the voltage across the capacitor C4 from the base to the emitter of the transistor Q1. A Colpitts oscillating circuit is structured as described above.

A capacitor C6 is connected in series between the emitter of the transistor Q1 and the drive-signal output terminal To, and a capacitor C7 is connected in parallel between the drive-signal output terminal To and the ground. These capacitors C6 and C7 constitute an impedance matching circuit 3 between the high-frequency superposing module 1 and the laser diode LD. The oscillation frequency of the Colpitts oscillating circuit is determined by the values of the capacitors C3, C4, C5, C6, and C7 and inductor L1.

An oscillation signal is drawn across the resistor R3 disposed between the emitter of the transistor Q1 and the ground, i.e., from the emitter of the transistor Q1. In this manner, an oscillation signal is sent to the laser diode LD.

A voltage input via a control-voltage input terminal Tc controls oscillation. A switch SW is disposed between the control-voltage input terminal Tc and the ground terminal GND so that oscillation can be turned ON/OFF by toggling the switch SW. When the switch SW is open, the potential at the base of the transistor Q1 is determined by the division ratio between the resistors R12 and R3 and the power supply voltage applied to the power input terminal VCC. When the switch SW is OFF (i.e., the control-voltage input terminal Tc is open), the potential Vb1 at the base of the transistor Q1 is determined based on the following expression:

$$Vb1 = Vcc \cdot R3/(R3+R12)$$

where Vcc is the power supply voltage. When the switch SW is ON (i.e., the control-voltage input terminal Tc has a potential equal to the ground level), the potential Vb2 at the base of the transistor Q1 is determined based on the following expression:

$$Vb2 = Vcc \cdot \{R3 \cdot R11/(R3+R11)\}/\{R12+R3 \cdot R11/(R3+R11)\}$$

where Vcc is the power supply voltage. It is noted that in the above expressions, the voltage drop from the base to the emitter of the transistor Q1 is not counted. In the oscillating circuit 2, the potential at the base of the transistor Q1 must change so as to satisfy the relationship of Vb2<Vth<Vb1, where Vth is a threshold between when the oscillation circuit 2 is activated (ON) and when the oscillating circuit 2 is deactivated (OFF). In other words, the values of the bias resistors R11, R12, and R3 need to be determined so that the oscillating circuit 2 stays ON (activated) while the potential at the base of the transistor Q1 is Vb1 or the oscillating circuit 2 is turned OFF (deactivated) when the potential at the base of the transistor Q1 drops to Vb2. If the value of the resistor R3 is fixed to a particular value, the values of the resistors R11 and R12 are determined to satisfy the above-described requirement.

Figure 2:
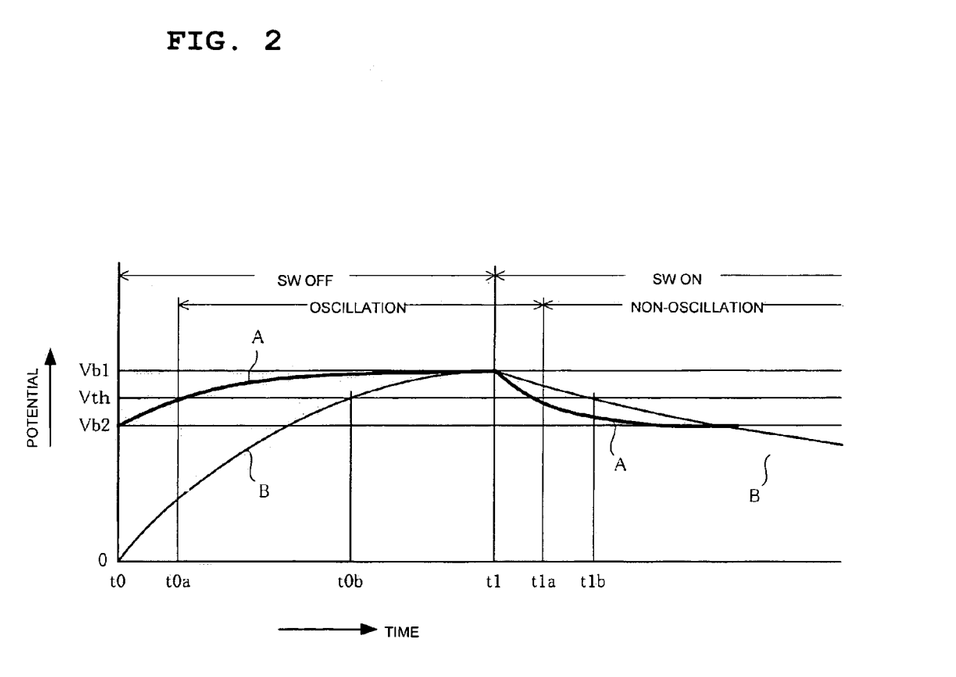
FIG. 2 includes two curves, each showing how the potential at the base of a transistor in the oscillating circuit of a high-frequency superposing module changes when a switch in the same circuit is turned ON/OFF.

FIG. 2 includes two curves each showing the change in potential at the base of a transistor. Curve A shows a change in the potential at the base of the transistor Q1 according to ON/OFF of the switch SW in FIG. 1. As shown, when the switch SW is turned OFF at the time of t0, the potential rises from Vb2 exponentially with a predetermined time constant and exceeds the threshold Vth at the time of t0a, when the oscillating circuit 2 is activated (oscillation starts). Subsequently, when the switch SW is turned ON at the time of t1, the capacitors C3 and C4 in FIG. 1 are discharged to the ground via the resistor R11 and the switch SW, and the capacitor C5 is discharged via the resistor R3, thus decreasing the potential at the base of the transistor Q1. The oscillating circuit 2 is deactivated (oscillation stops) at the time of t1a, when the potential drops below the threshold Vth.

Curve B in FIG. 2 shows a change in the potential at the base of the transistor Q1 of the conventional oscillating circuit in FIG. 8. The OFF state of the switch SW in FIG. 1 corresponds to a state in which a potential is applied to the control terminal RMS in FIG. 8, and the ON state of the switch SW in FIG. 1 corresponds to a state in which the control terminal RMS in FIG. 8 is open. As shown in curve B, the potential at the base of the transistor Q1 increases from 0 V when a voltage is applied to the control terminal RMS, and then exceeds the threshold Vth at the time of t0b, which is later than t0a. In FIG. 8, the discharge circuit section including the capacitors connected to the transistor Q1 has a large discharge time constant, and therefore, when the control terminal RMS is open at the time of t1, the potential at the base of the transistor Q1 decreases gradually, thus dropping below the threshold Vth at the time of t1b, which is later than t1a.

As described above and shown in the curves in FIG. 2, the oscillating circuit 2 in FIG. 1 can be activated/deactivated quickly in response to the switching of the switch SW.

In the oscillating circuit 2 in FIG. 1, a bias resistor Ra may be provided between the base of the transistor Q1 and the ground. In this case, the values of the resistors R11, R12, R3, and Ra need to be determined so as to satisfy the relationship of Vb2<Vth<Vb1. If the resistors R3 and Ra are fixed to particular values, the values of the resistors R11 and R12 need to be determined as required.

Figure 3:
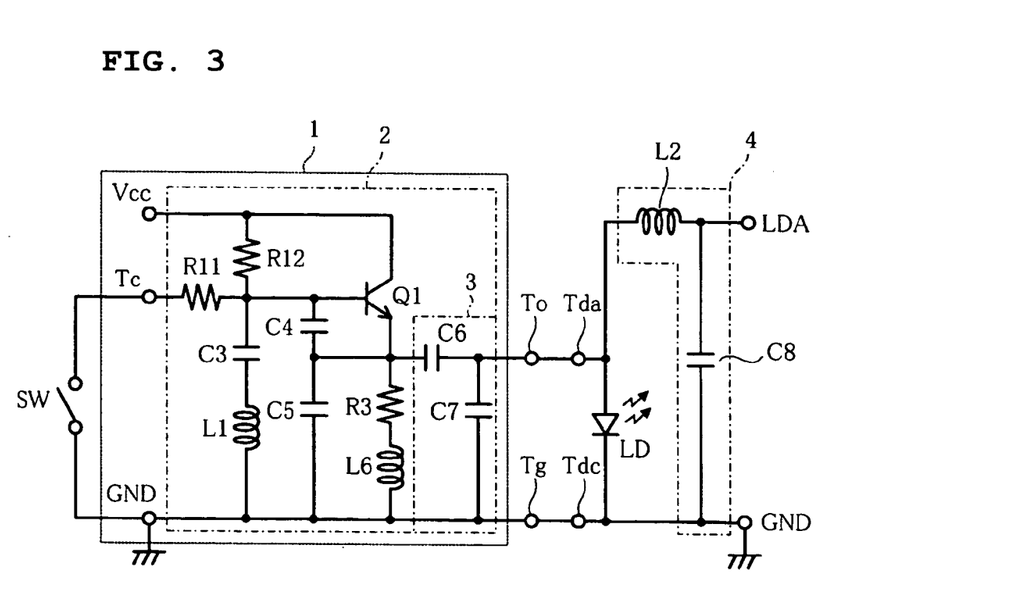
FIG. 3 is a circuit diagram of a high-frequency superposing module for driving a laser diode according to a second preferred embodiment of the present invention.

FIG. 3 is a circuit diagram of a high-frequency superposing module 1 for driving a laser diode LD according to a second preferred embodiment of the present invention. In the second preferred embodiment, a series circuit section including a resistor R3 and an inductor L6 is disposed between the emitter of a transistor Q1 and the ground. This inductor L6 increases the impedance for a high-frequency signal to enhance an oscillation output.

Figure 4:
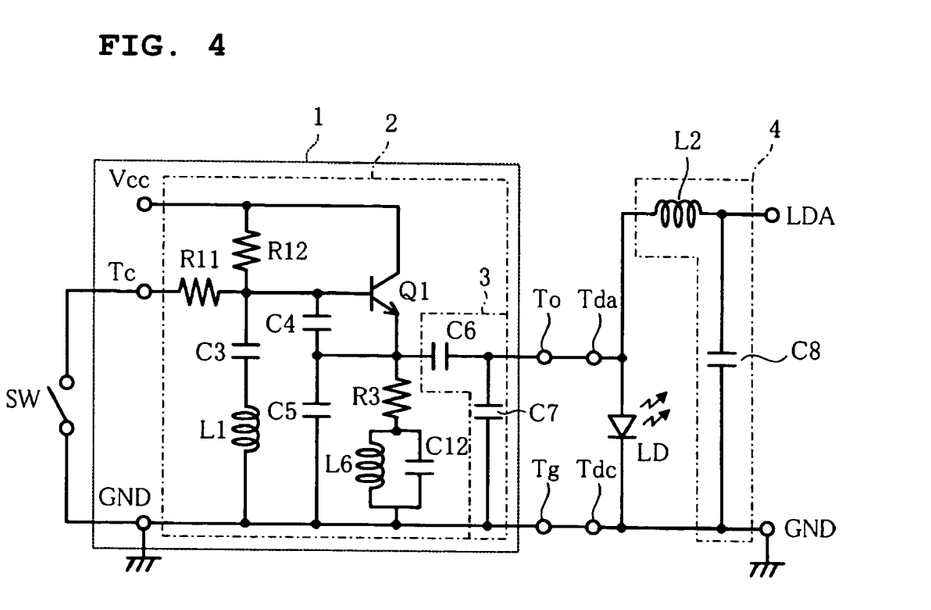
FIG. 4 is a circuit diagram of a high-frequency superposing module for driving a laser diode according to a third preferred embodiment of the present invention.

FIG. 4 is a circuit diagram of a high-frequency superposing module 1 for driving a laser diode LD according to a third preferred embodiment of the present invention. In the third preferred embodiment, a series circuit section including a parallel circuit section (an inductor L6 and a capacitor C12) and a resistor R3 is disposed between the emitter of a transistor Q1 and the ground. This structure increases the impedance for the parallel resonating frequency with the inductor L6 and the capacitor C12. By matching this parallel resonating frequency to the oscillation frequency, an oscillation output can be increased.

Figure 5:
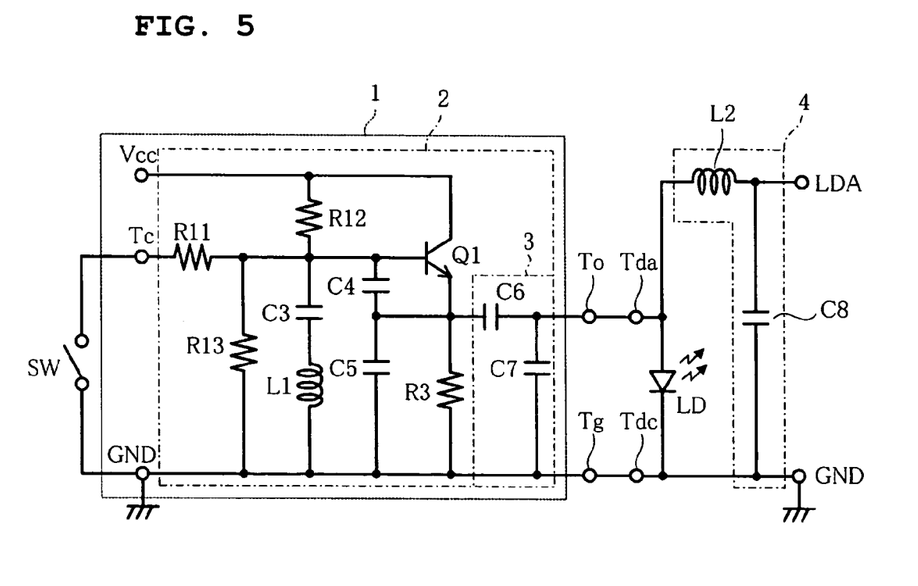
FIG. 5 is a circuit diagram of a high-frequency superposing module for driving a laser diode according to a fourth preferred embodiment of the present invention.

FIG. 5 is a circuit diagram of a high-frequency superposing module 1 for driving a laser diode LD according to a fourth preferred embodiment of the present invention. In the fourth preferred embodiment, a resistor R13 is disposed between the base of a transistor Q1 and the ground. This structure reduces the fluctuation of the base bias voltage of the transistor Q1 with respect to the fluctuation of the supply voltage, thereby stabilizing an oscillation output.

Figure 6:
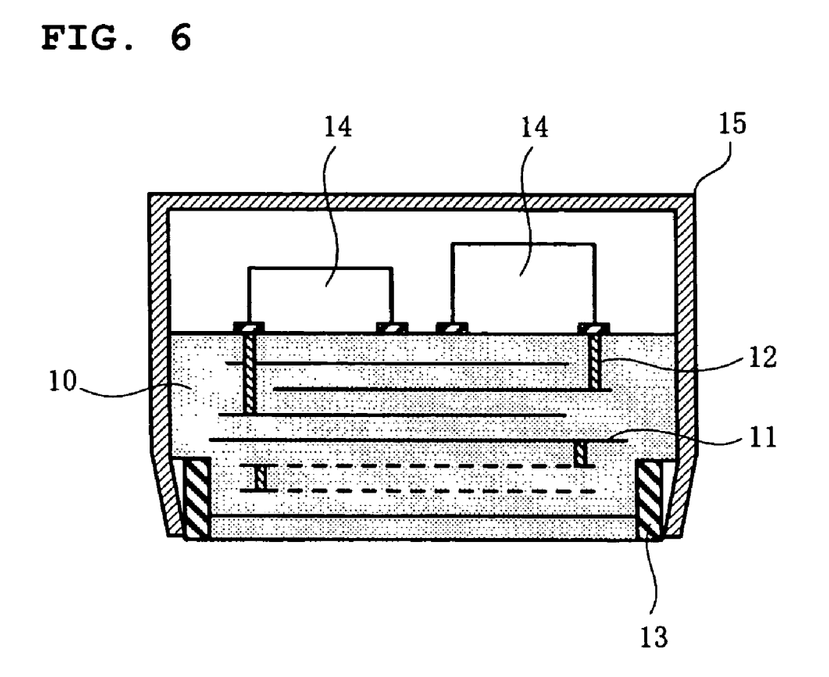
FIG. 6 is a sectional view of a high-frequency superposing module.
Figures 7A, 7E:
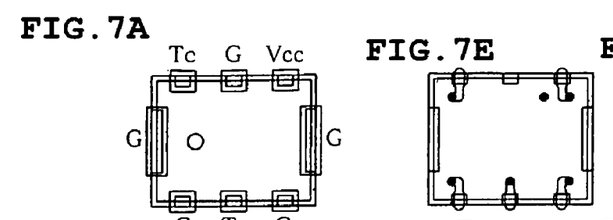
FIGS. 7A to 7N are plan views of the layers of the ceramic multilayer substrate shown in FIG. 6.
Figures 7B, 7F:
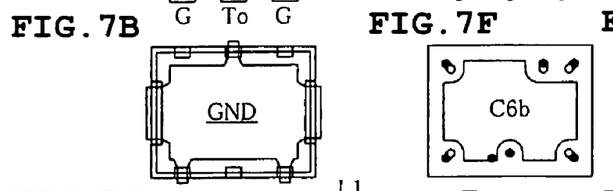
Figure 7C:
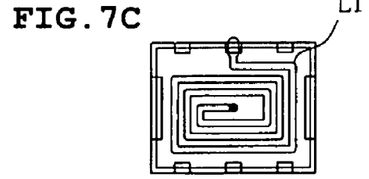
Figure 7D:
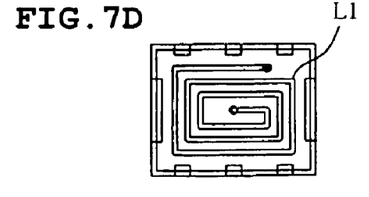
Figure 7G:
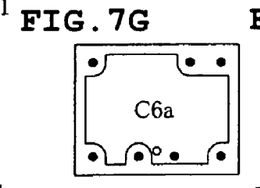
Figure 7H:
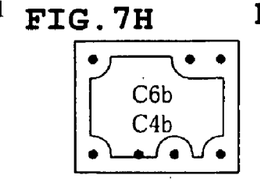
Figure 7I:
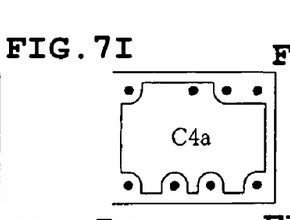
Figure 7J:
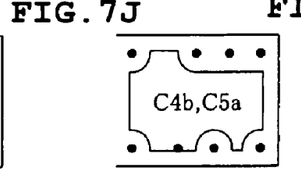
Figure 7K:
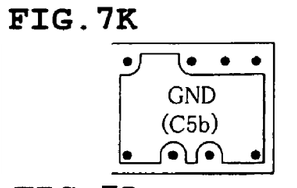
Figure 7L:
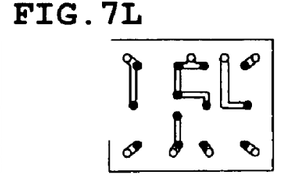
Figure 7M:
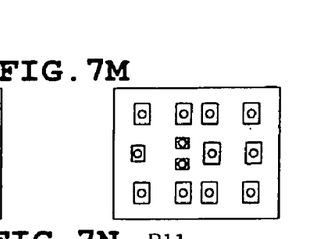
Figure 7N:
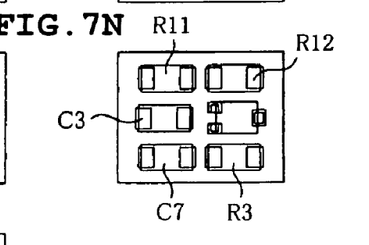

FIGS. 6 and 7A to 7N illustrate the structure of the high-frequency superposing module 1 for driving the laser diode LD shown in FIG. 1. FIG. 6 is a sectional view of the high-frequency superposing module 1 in FIG. 1. As shown, the high-frequency superposing module 1 includes a ceramic multilayer substrate 10 including a plurality of laminated ceramic layers having various conductive patterns 11. The ceramic multilayer substrate 10 has therein via holes 12 in addition to the conductive patterns 11. The high-frequency superposing module 1 also includes terminal electrodes 13 in its lower portion. The ceramic multilayer substrate 10 has surface mount components 14 on its upper surface. The oscillating circuit 2 (shown in FIG. 1) is shielded with a metal case 15 covering the sides and the upper surface of the ceramic multilayer substrate 10.

FIGS. 7A to 7N are plan views of the layers of the ceramic multilayer substrate 10 shown in FIG. 6. FIGS. 7A to 7M are layers as viewed from the bottom. FIG. 7A shows the bottommost layer and FIG. 7M shows the topmost layer. The layer in FIG. 7M shows patterns for chip components on the mount surface. FIG. 7N is a top view of the mount surface provided with the chip components.

FIG. 7A shows ground terminals G. The ground electrode GND occupies most of the entire surface of the layer in FIG. 7B. A line defining the inductor L1 is disposed on the layers in FIGS. 7C and 7D. Electrodes defining the capacitors C6, C4, and C5 and the ground electrode are disposed on the layers in FIGS. 7F to 7K. As shown in FIG. 6N, chip components such as the capacitors C3 and C7, resistors R3, R11, and R12, and transistor Q1 are mounted on the upper surface of the ceramic multilayer substrate 10. The symbols in FIGS. 7A to 7N correspond to those of the circuit elements in FIG. 1. In FIGS. 7A to 7N, two capacitor symbols different from each other only in the suffix a or b, such as C6a and C6b, represent one electrode and the other electrode of the same capacitor.

As described above, capacitors and inductors are preferably disposed in the ceramic multilayer substrate and other components including transistors are mounted on top of the ceramic multilayer substrate, thereby contributing to the compact design of the high-frequency superposing module for driving the laser diode.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A high-frequency superposing module for driving a laser diode, comprising:
   an oscillator for superposing a high-frequency current for the laser diode comprising:
      an oscillating active element;
      a capacitor connected between a feedback-signal input terminal of the oscillating active element and a ground;
      a first bias resistor connected between the feedback-signal input terminal and a power input terminal; and
      a second bias resistor connected between the feedback-signal input terminal and a control-voltage input terminal; wherein
      the first bias resistor and the second bias resistor have values such that when the control-voltage input terminal is grounded, the bias voltage at the feedback-signal input terminal is above the ground potential and below a threshold for continuous oscillation of the oscillating active element, and when the control-voltage input terminal is open, the bias voltage at the feedback-signal input terminal is above the threshold;
   a drive-signal output terminal connected to the anode of the laser diode; and
   an impedance matching circuit connected between the drive-signal output terminal and an output section of the oscillator.

2. The high-frequency superposing module for driving a laser diode according to claim 1, wherein a portion of the oscillating circuit includes a conductive pattern disposed in a ceramic multilayer substrate, and a component constituting at least a portion of the oscillating circuit and the impedance matching circuit is mounted on the ceramic multilayer substrate.

3. The high-frequency superposing module for driving a laser diode according to claim 1, further comprising a noise suppression filter circuit disposed between the power input terminal and the laser diode.

4. The high-frequency superposing module for driving a laser diode according to claim 3, wherein the noise suppression filter includes a capacitor and an inductor.

5. The high-frequency superposing module for driving a laser diode according to claim 1, wherein the impedance matching circuit including the series capacitor and the parallel capacitor is arranged for impedance matching between the oscillating circuit and the laser diode.

6. The high-frequency superposing module for driving a laser diode according to claim 1, wherein the oscillating circuit includes a transistor, a first resistor connected between a base and a collector of the transistor and a second resistor connected between an emitter of the transistor and the ground.

7. The high-frequency superposing module for driving a laser diode according to claim 6, wherein a first series circuit including a capacitor and an inductor and a second series circuit including at least two capacitors are connected between the base of the transistor and the ground.

8. The high-frequency superposing module for driving a laser diode according to claim 1, wherein the oscillating circuit is a Colpitts oscillating circuit.

9. The high-frequency superposing module for driving a laser diode according to claim 6, wherein the series capacitor is connected in series between the emitter of the transistor and the drive-signal output terminal.

10. The high-frequency superposing module for driving a laser diode according to claim 6, wherein the parallel capacitor is connected in parallel between the drive-signal output terminal and the ground.

11. The high-frequency superposing module for driving a laser diode according to claim 6, wherein a series circuit including a resistor and an inductor is disposed between the emitter of the transistor and the ground.

12. The high-frequency superposing module for driving a laser diode according to claim 6, wherein a series circuit including a parallel circuit having an inductor and a capacitor, and a resistor, are disposed between the emitter of the transistor and the ground.

13. The high-frequency superposing module for driving a laser diode according to claim 6, wherein a resistor is disposed between the base of the transistor and the ground.

14. The high-frequency superposing module for driving a laser diode according to claim 2, wherein the ceramic multilayer substrate includes a plurality of laminated ceramic layers having conductive patterns disposed thereon.

15. The high-frequency superposing module for driving a laser diode according to claim 2, wherein the ceramic multilayer substrate includes a plurality of via holes formed therein.

16. The high-frequency superposing module for driving a laser diode according to claim 2, further comprising a metal case arranged to cover sides of the ceramic multilayer substrate.

* * * * *